(12) United States Patent
Wang et al.

(10) Patent No.: US 11,403,980 B2
(45) Date of Patent: Aug. 2, 2022

(54) DISCHARGE CONTROL CIRCUIT AND METHOD FOR DISPLAY PANEL, AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Jianjun Wang, Beijing (CN); Min Wang, Beijing (CN); Rui Ma, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 926 days.

(21) Appl. No.: 15/763,135

(22) PCT Filed: Oct. 25, 2017

(86) PCT No.: PCT/CN2017/107574
§ 371 (c)(1),
(2) Date: Mar. 26, 2018

(87) PCT Pub. No.: WO2018/188312
PCT Pub. Date: Oct. 18, 2018

(65) Prior Publication Data
US 2020/0394944 A1 Dec. 17, 2020

(30) Foreign Application Priority Data
Apr. 11, 2017 (CN) .......................... 201710232606.1

(51) Int. Cl.
*G09G 3/20* (2006.01)
*H03K 3/037* (2006.01)

(52) U.S. Cl.
CPC ............ *G09G 3/20* (2013.01); *H03K 3/0377* (2013.01); *G09G 2310/08* (2013.01); *G09G 2330/028* (2013.01)

(58) Field of Classification Search
CPC ................ G09G 3/20; G09G 2310/08; G09G 2330/028; G09G 2310/0267;
(Continued)

(56) References Cited

U.S. PATENT DOCUMENTS

| 2005/0275613 | A1 | 12/2005 | Woo et al. | |
|---|---|---|---|---|
| 2009/0231253 | A1* | 9/2009 | Hu | G09G 3/3648 345/87 |
| 2017/0103699 | A1* | 4/2017 | Lin | G09G 3/2092 |

FOREIGN PATENT DOCUMENTS

| CN | 101101385 | A | * | 1/2008 |
|---|---|---|---|---|
| CN | 101101385 | A | | 1/2008 |

(Continued)

OTHER PUBLICATIONS

NASA Tech Brief (Brief 69-10143; May 1969—2 pgs).May 1969.*
Search Report from International Application No. PCT/CN2017/107574 dated Jan. 31, 2018.

*Primary Examiner* — Temesghen Ghebretinsae
*Assistant Examiner* — Karin Kiyabu
(74) *Attorney, Agent, or Firm* — Calfee, Halter & Griswold LLP

(57) ABSTRACT

A discharge control circuit for a display panel includes a flip-flop configured to generate a representation of a power supply voltage of the display panel based on the power supply voltage, the representation of the power supply voltage enabling a discharge condition under which a pixel array of the display panel is discharged to be not satisfied
(Continued)

upon power-on or during operation of the display panel and to be satisfied upon shutdown of the display panel; and a level shifter configured to level-shift timing signals for controlling operation of the pixel array, to provide the level-shifted timing signals to the display panel, and to initiate discharge of the pixel array in response to the discharge condition being satisfied.

11 Claims, 4 Drawing Sheets

(58) Field of Classification Search
CPC ..... G09G 2310/0289; G09G 2330/026; G09G 2330/027; H03K 3/0377
See application file for complete search history.

(56) References Cited

FOREIGN PATENT DOCUMENTS

| | | |
|---|---|---|
| CN | 101299322 A | 11/2008 |
| CN | 101546536 A | 9/2009 |
| CN | 107068036 A | 8/2017 |

\* cited by examiner

DISCHARGE CONTROL CIRCUIT AND METHOD FOR DISPLAY PANEL, AND DISPLAY APPARATUS

CROSS REFERENCE TO RELATED APPLICATIONS

This application is the U.S. national phase entry of PCT/CN2017/107574, with an international filing date of Oct. 25, 2017, which claims the benefit of China Patent Application No. 201710232606.1, filed on Apr. 11, 2017, the entire disclosures of which are incorporated herein by reference.

TECHNICAL FIELD

The disclosure relates to the field of display technology, and particularly to a discharge control circuit and method for a display panel, and a display device including the discharge control circuit.

BACKGROUND

A display device is generally provided with a discharge control circuit for eliminating shutdown artifacts. The discharge control circuit monitors a change in the power supply voltage when the display device is being shut down and initiates discharge of the pixel array in the display device when a discharge condition is satisfied by, for example, turning on the switching thin-film transistors (TFTs) in individual pixel circuits. This allows the charges stored in the pixel circuits to be discharged, thereby eliminating the shutdown artifacts. However, where the power supply voltage is unstable, for example, the power supply voltage may slowly rise to a rated value upon the power-on of the display device, the discharge control circuit may malfunction due to an erroneous detection that the discharge condition is satisfied, resulting in undesirable damages to the pixel circuits or the like.

SUMMARY

It would be advantageous to provide a discharge control circuit that may alleviate, mitigate or eliminate one or more of the above problems.

According to an aspect of the present disclosure, a discharge control circuit is provided for a display panel comprising a pixel array. The discharge control circuit comprising a flip-flop configured to generate a representation of a power supply voltage of the display panel based on the power supply voltage, the representation of the power supply voltage enabling a discharge condition under which the pixel array of the display panel is discharged to be not satisfied upon power-on or during operation of the display panel and to be satisfied upon shutdown of the display panel; and a level shifter configured to level-shift timing signals for controlling operation of the pixel array, to provide the level-shifted timing signals to the display panel, and to initiate discharge of the pixel array in response to the discharge condition being satisfied.

In some exemplary embodiments, the flip-flop is configured to generate the representation of the power supply voltage by converting a rising edge of the power supply voltage into a steeper rising edge in the representation of the power supply voltage or canceling the rising edge of the power supply voltage in the representation of the power supply voltage.

In some exemplary embodiments, the flip-flop comprises a Schmitt trigger configured such that the rising edge of the power supply voltage is converted into the steeper rising edge in the representation of the power supply voltage and a falling edge of the power supply voltage is converted into a steeper falling edge in the representation of the power supply voltage.

In some exemplary embodiments, the Schmitt trigger has a positive direction threshold voltage selected such that during the rising edge of the power supply voltage the rising edge of the power supply voltage is converted into the rising edge in the representation of the power supply voltage before the discharge condition is satisfied.

In some exemplary embodiments, the Schmitt trigger has a negative direction threshold voltage within a selected range less than a rated value of the power supply voltage such that during the falling edge of the power supply voltage the falling edge of the power supply voltage is converted as soon as possible into the falling edge in the representation of the power supply voltage. In some embodiments, the negative direction threshold voltage is in a range of 80% to 90% of the rated value of the power supply voltage.

In some exemplary embodiments, the flip-flop comprises a falling edge flip-flop that is insensitive to rising edges such that the rising edge of the power supply voltage is canceled in the representation of the power supply voltage. In some exemplary embodiments, the discharge control circuit further comprises a voltage divider circuit connected between the power supply voltage and a ground voltage to output a divided power supply voltage. The flip-flop is configured to receive and convert the divided voltage supply voltage into the representation of the power supply voltage. In some embodiments, the flip-flop is built in the level shifter. In some embodiments, the voltage divider circuit comprises resistors connected in series.

In some exemplary embodiments, the discharge control circuit further comprises a voltage converter operable to generate the power supply voltage from an input voltage. In some embodiments, the voltage converter is selected from the group consisting of a linear regulator and a direct current/direct current converter. In some embodiments, the linear regulator is a low dropout linear regulator.

According to another aspect of the present disclosure, a display device is provided comprising a display panel comprising a pixel array; a timing controller configured to provide timing signals for controlling operation of the pixel array; and the discharge control circuit as described above.

According to yet another aspect of the present disclosure, a method of controlling discharge of a pixel array in a display panel using the discharge control circuit as described above is provided. The method comprises generating a representation of a power supply voltage of the display panel based on the power supply voltage, the representation of the power supply voltage enabling a discharge condition under which the pixel array of the display panel is discharged to be not satisfied upon power-on or during operation of the display panel and to be satisfied upon shutdown of the display panel; initiating the discharge of the pixel array in response to the discharge condition being satisfied.

In some exemplary embodiments, the generating the representation of the power supply voltage comprises converting a rising edge of the power supply voltage into a steeper rising edge in the representation of the power supply voltage or canceling the rising edge of the power supply voltage in the representation of the power supply voltage.

These and other aspects of the present disclosure will be apparent from and elucidated with reference to the embodiment(s) described hereinafter.

BRIEF DESCRIPTION OF THE DRAWINGS

FIG. 5 is a block diagram of a variation of the discharge control circuit shown in

FIG. 3;

DETAILED DESCRIPTION

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

Figure 1:
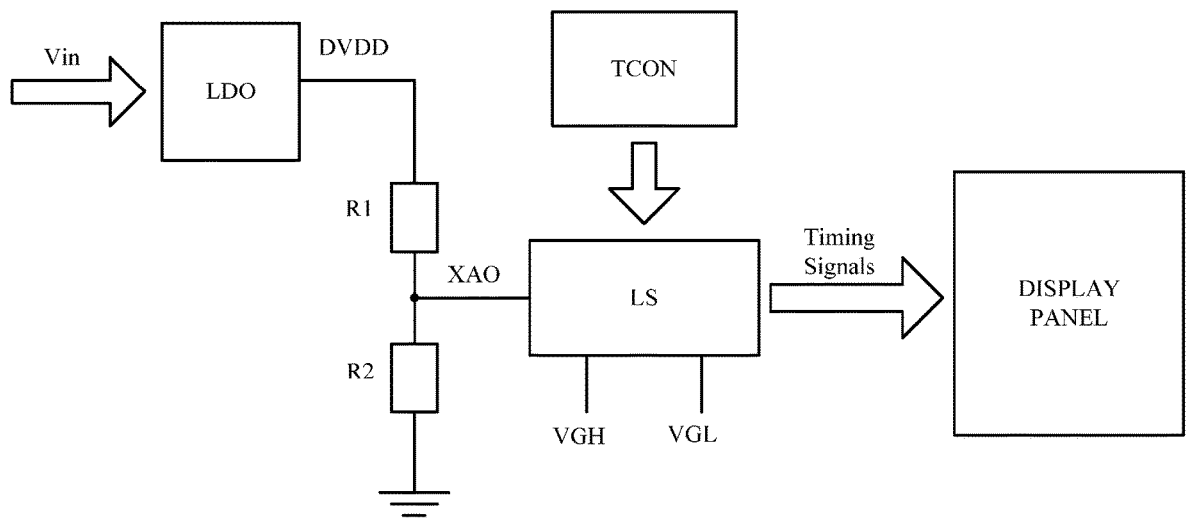
FIG. 1 is a block diagram of a typical discharge control circuit for a display panel.

FIG. 1 is a block diagram of a typical discharge control circuit for a display panel. As shown in FIG. 1, the discharge control circuit includes a low-dropout regulator LDO, resistors R1 and R2, and a level shifter LS.

The low dropout regulator LDO converts an input voltage Vin into a power supply voltage DVDD. The power supply voltage DVDD is divided by the resistors R1 and R2, and the divided voltage is supplied to the level shifter LS as a voltage monitor signal XAO.

The level shifter LS operates to level-shift timing signals from a timing controller TCON such that the level-shifted timing signals satisfy the logic level requirements needed for driving the display panel. For example, the timing controller TCON operates in a logic level configuration having a high level of 3.3 V and a low level of 0 V while the display panel operates in a logic level configuration having a high level of VGH (e.g., 24 V) and a low level of VGL (e.g., −7 V). In this case, the level shifter LS operates to shift the high level and the low level of the timing signals supplied from the timing controller TCON from 3.3 V to 24 V and from 0 V to −7 V, respectively, while maintaining the timing of the timing signals unchanged.

The level shifter LS also operates to initiate discharge of a pixel array in the display panel. Specifically, when the power is turned off, the voltage monitor signal XAO decreases with the power supply voltage DVDD, and when the level shifter LS detects that a discharge condition (e.g., XAO drops to a critical value (e.g., 1.2 V) and VGH>15 V) is satisfied, the level shifter LS may output timing signals that cause the pixel array in the display panel to be discharged regardless of the timing signals from the timing controller TCON. For example, all the outputs of the level shifter LS follow the high level VGH, so that the switching TFTs of the respective pixel circuits in the pixel array are turned on and the charges stored in the respective pixel circuits are discharged, thereby eliminating the shutdown artifacts. As mentioned above, the level shifter LS may erroneously detect that the discharge condition is satisfied due to a slow rising edge of the input voltage Vin at the time of power-on, and hence undesirably start the discharging function. Since the implementation of the level shifter LS is known in the art, the detailed description of which is omitted herein so as not to obscure the subject matter of the present disclosure.

Figure 2:
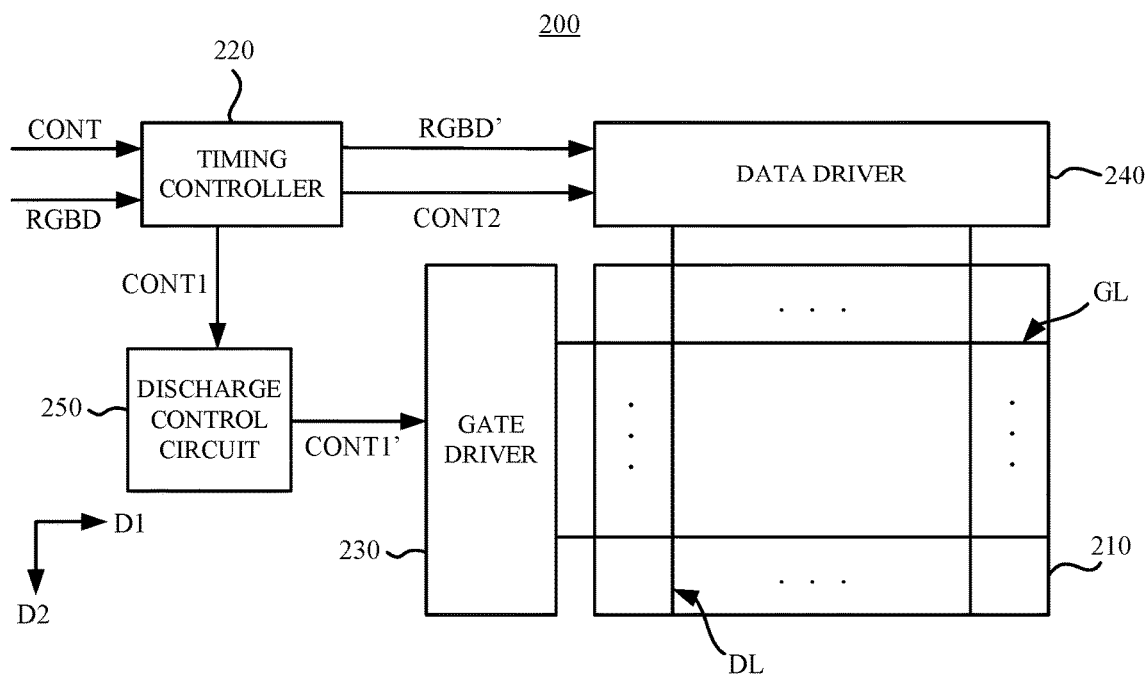
FIG. 2 is a block diagram of a display device according to an embodiment of the present disclosure.

FIG. 2 is a block diagram of a display apparatus 200 according to an embodiment of the present disclosure. Referring to FIG. 2, the display device 200 includes a display panel 210, a timing controller 220, a gate driver 230, a data driver 240, and a discharge control circuit 250.

The display panel 210 is connected to a plurality of gate lines GL and a plurality of data lines DL. The display panel 210 displays an image having a plurality of grayscales based on output image data RGBD'. The gate lines GL may extend in a first direction D1 and the data lines DL may extend in a second direction D2 that intersects (e.g., is substantially perpendicular to) the first direction D1. The display panel 210 may include a pixel array including a plurality of pixels (not shown) arranged in a matrix, each pixel being electrically connected to a corresponding one of the gate lines GL and a corresponding one of the data lines DL. Depending on the implementation of the display panel 210, the pixels may be liquid crystal (LC)-based pixels or organic light emitting device (e.g., organic light emitting diode)-based pixels.

The timing controller 220 controls the operation of the display panel 210, the gate driver 230, and the data driver 240. The timing controller 220 receives input image data RGBD and input control signals CONT from an external device. The input image data RGBD may include a plurality of input pixel data for the plurality of pixels. Each input pixel data may include red, green, and blue grayscale data R, and B for a corresponding one of the plurality of pixels. The input control signals CONT may include a main clock signal, a data enable signal, a vertical synchronization signal, a horizontal synchronization signal, and the like. The timing controller 220 generates the output image data RGBD', a first control signal CONT1, and a second control signal CONT2 based on the input image data RGBD and the input control signals CONT. The output image data RGBD' is supplied to the data driver 240. In some embodiments, the output image data RGBD' may be substantially the same image data as the input image data RGBD. In some embodiments, the output image data RGBD' may be compensated image data generated by compensating the input image data RGBD. The first control signal CONT1 is supplied to the discharge control circuit 250 for level shift. The level-shifted first control signal CONT1' is supplied to the gate driver 230, and the driving timing of the gate driver 230 may be controlled based on the level-shifted first control signal CONT1'. The second control signal CONT2 is supplied to the data driver 240 and the driving timing of the data driver 240 may be controlled based on the second control signal CONT2.

The gate driver 230 receives the level-shifted first control signal CONT1' from the discharging control circuit 250. The gate driver 230 generates a plurality of gate signals for driving the gate lines GL based on the level-shifted first control signal CONT1'. The gate driver 230 may sequentially apply the plurality of gate signals to the gate lines GL. In some exemplary embodiments, the gate driver 230 may be disposed (e.g., directly integrated) on the display panel 210 or may be connected to the display panel 210, for example, in a tape carrier package (TCP) type. Therefore, the gate driver 230 may be regarded as part of the display panel 210.

The data driver 240 receives the second control signal CONT2 and the output image data RGBD' from the timing controller 220. The data driver 240 generates a plurality of data voltages (e.g., analog data voltages) based on the second control signal CONT2 and the output image data RGBD' (e.g., digital image data). The data driver 240 may apply the plurality of data voltages to the data lines DL.

The discharge control circuit 250 operates to level shift the first control signal CONT1 from the timing controller 220 so that the level-shifted first control signal CONT1' satisfies the logic level requirement needed for driving the display panel 210. The discharge control circuit 250 also operates to initiate the discharge of the pixel array in the display panel 210. The configuration of the discharge control circuit 250 will be described in detail below with reference to FIGS. 3 to 6.

The display device 200 may be any product or component having a display function, such as a mobile phone, a tablet computer, a television, a display, a notebook computer, a digital photo frame, a navigator and the like.

Figure 3:
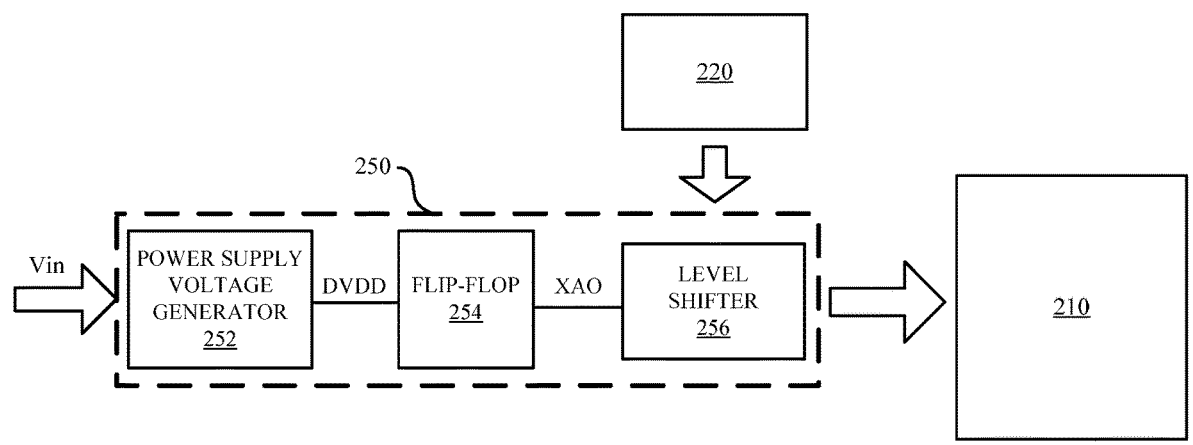
FIG. 3 is a block diagram of a discharge control circuit according to an embodiment of the present disclosure.

FIG. 3 is a block diagram of the discharge control circuit 250 in the display device 200 shown in FIG. 2. Referring to FIG. 3, the discharge control circuit 250 includes a power supply voltage generator 252, a flip-flop 254, and a level shifter 256, although the power supply voltage generator 252 is not necessary. Also shown in FIG. 3 is a timing controller 220 and a display panel 210 that are operably coupled to the level shifter 256.

The power supply voltage generator 252 operates to generate a power supply voltage DVDD from an input voltage Vin. This can be done by a voltage converter such as, for example, a direct current/direct current (DC/DC) converter or a low dropout voltage regulator (LDO).

The flip-flop 254 operates to generate a representation XAO of the power supply voltage DVDD based on the power supply voltage DVDD. As will be discussed below, the representation XAO of the power supply voltage enables a discharge condition at which the pixel array (not shown in the figure) of the display panel 210 is discharged to be not satisfied upon power-on or during operation of the display panel 210 and to be satisfied upon shutdown of the display panel 210. Examples of the flip-flops 254 include, but are not limited to, a Schmitt trigger and a falling edge flip-flop.

The level shifter 256 operates to level-shift timing signals from the timing controller 220 and to provide the level-shifted timing signals to the display panel 210. The level shifter 256 is further operative to initiate the discharge of the pixel array in the display panel 210 in response to the discharge condition being satisfied. As mentioned above, this can be achieved by having all the outputs of the level shifter 256 follow the high level, and the discharge condition includes the representation XAO of the power supply voltage DVDD has a critical value. This critical value may depend on the actual requirements.

By means of the flip-flop 254, a slow rising edge of the power supply voltage DVDD occurring, for example, at power-on is converted into a steeper rising edge in the representation XAO of the power supply voltage DVDD or even canceled (discussed below). This can prevent the discharge control circuit 250 from erroneously detecting that the discharge condition is satisfied during power-on, thereby avoiding the malfunction of the display panel 210.

Figure 4:
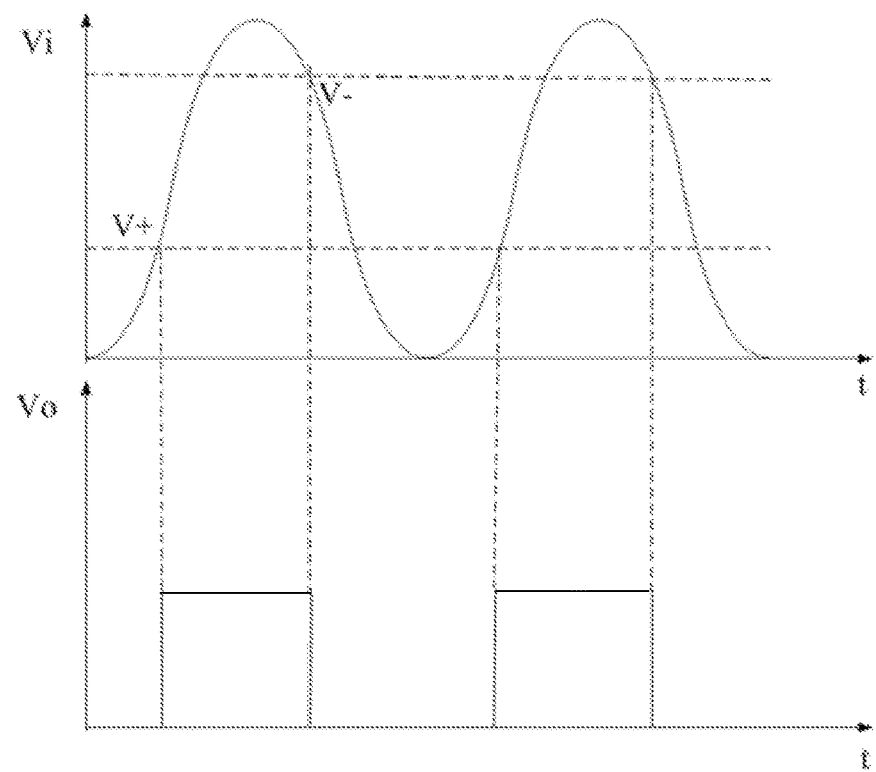
FIG. 4 is a schematic diagram illustrating an input-output characteristic of a Schmitt trigger acting as the flip-flop in the discharge control circuit shown in FIG. 3.

FIG. 4 is a diagram illustrating an input-output characteristic of a Schmitt trigger acting as the flip-flop 254 in FIG. 3.

As is known, the Schmitt trigger has a positive direction threshold voltage V+ and a negative direction threshold voltage V−. As shown in FIG. 4, when the input voltage Vi increases from low to high and reaches the positive direction threshold voltage V+, the output voltage Vo transitions (from a low level to a high level in this example), and when the input voltage Vi decreases from high to low and reaches V−, the output voltage Vo transitions (from a high level to a low level in this example).

Such an input-output characteristic of the Schmitt trigger can be used to advantage such that the rising edge of the power supply voltage DVDD is converted into a steeper rising edge in the representation XAO of the power supply voltage DVDD. This makes it possible for the slow rising edge of the power supply voltage DVDD during power-up to not cause the discharge condition to be satisfied. In some embodiments, the positive direction threshold voltage V+ of the Schmitt trigger is set to have a small value so that the Schmitt trigger is triggered in a short time after the arrival of the power supply voltage DVDD during power-up and the rising edge of the power supply voltage DVDD is converted into the rising edge of the representation XAO of the power supply voltage DVDD before the discharge condition is satisfied, thereby preventing the discharge condition from being satisfied. In addition, a falling edge of the power supply voltage DVDD can be converted by the Schmitt trigger into a steeper falling edge in the representation XAO of the power supply voltage DVDD. In some embodiments, the negative direction threshold voltage V− of the Schmitt trigger is set to have a large value, for example, within a selected range that is less than the rated value of the power supply voltage DVDD. For example, a range of 80% to 90% of the rated value of the power supply voltage DVDD may be appropriate. This allows the Schmitt trigger to be triggered as early as possible during power-down, i.e., the falling edge of the power supply voltage DVDD is converted by the Schmitt trigger into a steeper falling edge as soon as possible. The discharge condition is satisfied in advance during the falling edge of the power supply voltage DVDD as compared to the case where the Schmitt trigger is otherwise absent, so that the discharge is initiated by the level shifter 256 as soon as possible and thus the shutdown artifacts are early eliminated.

In an alternative embodiment, the flip-flop 254 is implemented with a falling edge flip-flop. Unlike the Schmitt trigger which operates in a level-triggered manner, the falling-edge flip-flop operates in an edge-triggered manner and is therefore insensitive to the rising edge of the power supply voltage DVDD. This allows for cancellation of the rising edge of the power supply voltage DVDD in the representation XAO of the power supply voltage DVDD, thereby eliminating the possibility of discharge conditions being met during power-up. Additionally, the falling-edge flip-flop may operate to convert the falling edge of the power supply voltage DVDD into a steeper falling edge in the representation XAO of the power supply voltage DVDD. As a result, the level shifter 256 can normally detect the satisfaction of the discharge condition during power-down and initiate the discharge.

Although the flip-flop 254 is illustrated and described above as being separate from the level shifter 256, other embodiments are also contemplated.

Figure 5:
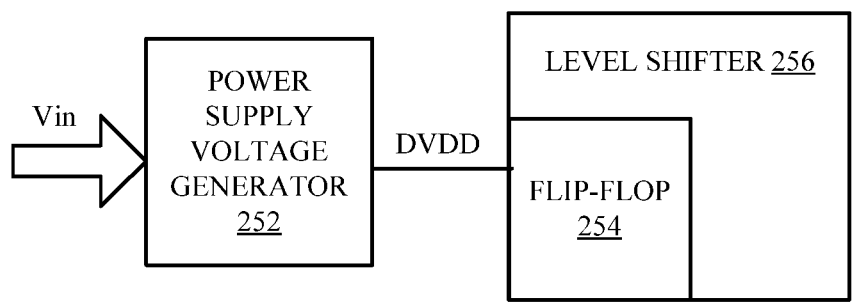

FIG. 5 is a block diagram of a variation 250A of the discharge control circuit 250 shown in FIG. 3. Referring to FIG. 5, the discharge control circuit 250A includes a power supply voltage generator 252, a flip-flop 254, and a level shifter 256. As mentioned previously, the power supply voltage generator 252 is not necessary.

The discharge control circuit 250A is different from the embodiment shown in FIG. 3 in that the flip-flop 254 is built-in (e.g., integrated) into the level shifter 256. This may facilitate simplification of the circuit connection and improve the reliability of the discharge control circuit. Other configurations of the power supply voltage generator 252, the flip-flop 254, and the level shifter 256 are the same as those described above with respect to FIGS. 2-4, and thus are not repeated here for conciseness.

Figure 6:
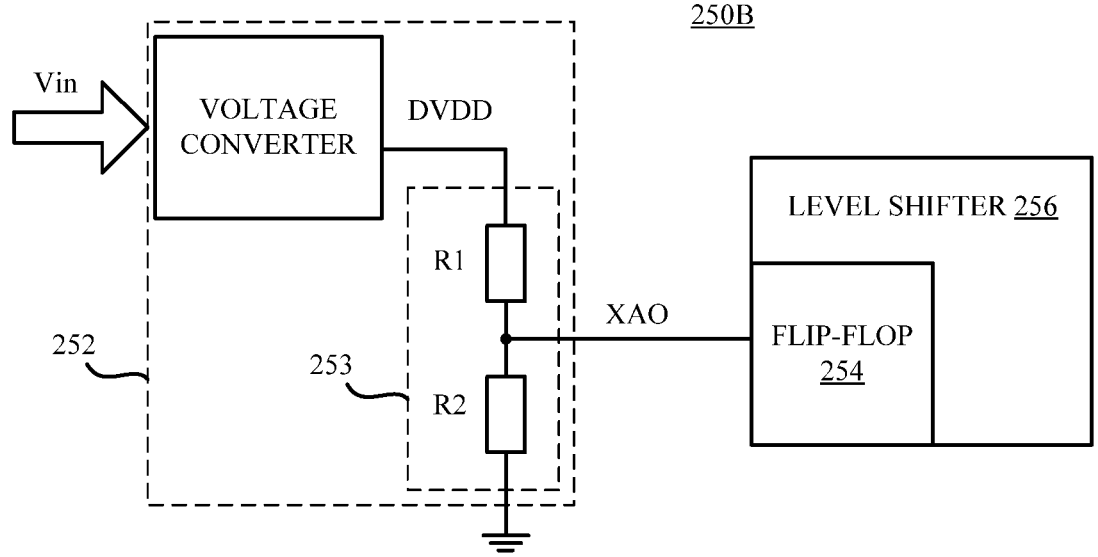
FIG. 6 is a block diagram of a variation of the discharge control circuit shown in FIG. 5.

FIG. 6 is a block diagram of a variation 250B of the discharge control circuit 250A shown in FIG. 5. Referring to FIG. 6, the discharge control circuit 250B includes a power supply voltage generator 252, a flip-flop 254, and a level shifter 256. As mentioned previously, the power supply voltage generator 252 is not necessary.

The discharge control circuit 250B is different from the embodiment shown in FIG. 5 in that the power supply voltage generator 252 includes a voltage converter such as, for example, a DC/DC converter or an LDO and a voltage divider circuit 253 connected in series with the voltage converter. The voltage divider circuit 253 is connected between the power supply voltage DVDD and a ground voltage so as to output a divided power supply voltage as the voltage monitor signal XAO that is provided to flip-flop 254. The configurations of the flip-flop 254 and the level shifter 256 are the same as those described above with respect to FIG. 5, and thus are not repeated here for conciseness. It will be understood that the configuration of the power supply voltage generator 252 in FIG. 6 may also be applied to the embodiment shown in FIG. 3.

In the embodiment of FIG. 6, the voltage divider circuit 253 includes resistors R1 and R2 that are connected in series, although other embodiments are also contemplated.

Figure 7:
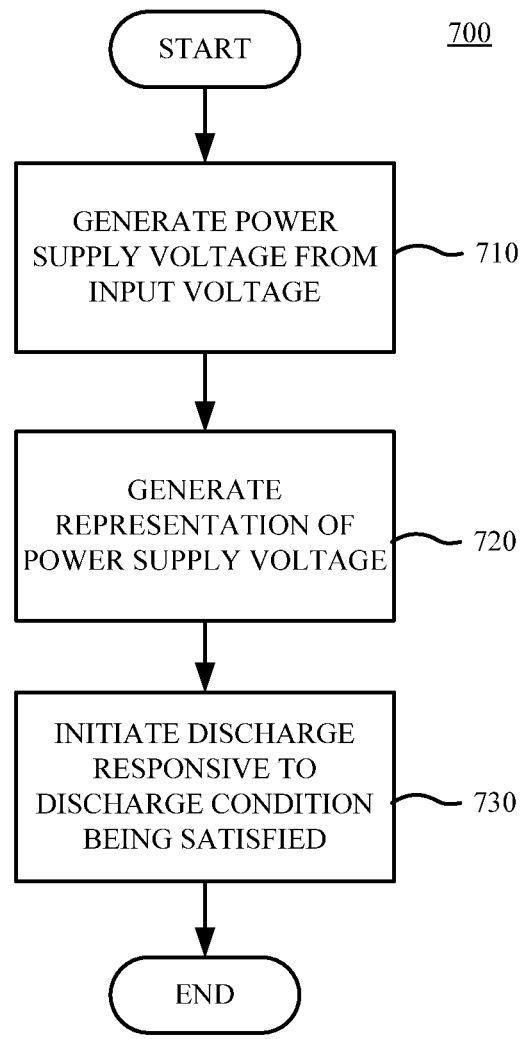
FIG. 7 is a flowchart of a discharge control method according to an embodiment of the present disclosure.

FIG. 7 is a flowchart of a discharge control method 700 according to an embodiment of the present disclosure. The method 700 is used for controlling discharge of the pixel array in the display panel.

At step 710, a power supply voltage is generated from an input voltage. At step 720, a representation of the power supply voltage is generated based on the power supply voltage of the display panel. At step 730, the discharge of the pixel array is initiated responsive to a discharge condition being satisfied.

In some embodiments, step 720 may include converting a rising edge of the power supply voltage to a steeper rising edge in the representation of the power supply voltage. In some embodiments, step 720 may include canceling a rising edge of the power supply voltage in the representation of the power supply voltage.

The implementation and the advantages of the method 700 have been described in detail above with reference to the discharge control circuit embodiments and therefore will not be repeated here for brevity.

Various modifications and variations to the present disclosure can be made by those skilled in the art without departing from the spirit and scope of the disclosure. Thus, if these modifications and variations to the present disclosure fall within the scope of the appended claims and equivalents thereof, the present disclosure is also intended to encompass these modifications and variations.

What is claimed is:

1. A discharge control circuit for a display panel, the display panel comprising a pixel array, the discharge control circuit comprising:
    a flip-flop configured to generate a representation of a power supply voltage of the display panel based on the power supply voltage, the representation of the power supply voltage enabling a discharge condition under which the pixel array of the display panel is discharged to be not satisfied upon power-on or during operation of the display panel and to be satisfied upon shutdown of the display panel; and
    a level shifter configured to level-shift timing signals for controlling operation of the pixel array, to provide the level-shifted timing signals to the display panel, and to initiate discharge of the pixel array in response to the discharge condition being satisfied,
    wherein the flip-flop comprises a Schmitt trigger configured such that a rising edge of the power supply voltage is converted into a steeper rising edge in the representation of the power supply voltage and a falling edge of the power supply voltage is converted into a steeper falling edge in the representation of the power supply voltage,
    wherein the Schmitt trigger has a positive direction threshold voltage selected such that during the rising edge of the power supply voltage the rising edge of the power supply voltage is converted into the rising edge in the representation of the power supply voltage before the discharge condition is satisfied, to prevent the discharge condition from being satisfied during power-on,
    wherein the Schmitt trigger has a negative direction threshold voltage within a selected range less than a rated value of the power supply voltage such that during the falling edge of the power supply voltage the falling edge of the power supply voltage is converted into the falling edge in the representation of the power supply voltage when the power supply voltage is less than the negative direction threshold voltage, and
    wherein the positive direction threshold voltage is less than the negative direction threshold voltage.

2. The discharge control circuit of claim 1, wherein the negative direction threshold voltage is in a range of 80% to 90% of the rated value of the power supply voltage.

3. The discharge control circuit of claim 1, further comprising a voltage divider circuit connected between the power supply voltage and a ground voltage to output a divided power supply voltage, wherein the flip-flop is configured to receive and convert the divided power supply voltage into the representation of the power supply voltage.

4. The discharge control circuit of claim 3, wherein the flip-flop is built in the level shifter.

5. The discharge control circuit of claim 3, wherein the voltage divider circuit comprises resistors connected in series.

6. The discharge control circuit of claim 1, further comprising a voltage converter operable to generate the power supply voltage from an input voltage.

7. The discharge control circuit of claim 6, wherein the voltage converter is selected from the group consisting of a linear regulator and a direct current/direct current converter.

8. The discharge control circuit of claim 7, wherein the linear regulator is a low dropout linear regulator.

9. A display device comprising:
a display panel comprising a pixel array;
a timing controller configured to provide timing signals for controlling operation of the pixel array; and
the discharge control circuit as claimed in claim 1.

10. A method of controlling discharge of a pixel array in a display panel using the discharge control circuit as claimed in claim 1, the method comprising:
generating, by the flip-flop, the representation of the power supply voltage of the display panel based on the power supply voltage, the representation of the power supply voltage enabling the discharge condition under which the pixel array of the display panel is discharged to be not satisfied upon power-on or during operation of the display panel and to be satisfied upon shutdown of the display panel;
initiating, by the level shifter, the discharge of the pixel array in response to the discharge condition being satisfied.

11. The method of claim 10, wherein the generating the representation of the power supply voltage comprises converting the rising edge of the power supply voltage into the steeper rising edge in the representation of the power supply voltage.

* * * * *